US008698557B2

(12) United States Patent
Cabrera et al.

(10) Patent No.: US 8,698,557 B2
(45) Date of Patent: Apr. 15, 2014

(54) HYBRID COUPLER

(75) Inventors: George Cabrera, Mason, OH (US); Dmitri Borodulin, South Lebanon, OH (US)

(73) Assignee: HBC Solutions, Inc., Englewood, CO (US)

( * ) Notice: Subject to any disclaimer, the term of this patent is extended or adjusted under 35 U.S.C. 154(b) by 145 days.

(21) Appl. No.: 13/271,317

(22) Filed: Oct. 12, 2011

(65) Prior Publication Data

US 2013/0093509 A1 Apr. 18, 2013

(51) Int. Cl.
*H03F 3/68* (2006.01)

(52) U.S. Cl.
USPC ........... 330/124 R; 330/53; 330/295; 330/286

(58) Field of Classification Search
USPC ................................ 330/124 R, 53, 295, 286
See application file for complete search history.

(56) References Cited

U.S. PATENT DOCUMENTS 3,789,315 A 1/1974 Beurrier
3,869,678 A * 3/1975 Mahoney ...................... 330/286
4,517,530 A * 5/1985 Sydnor ............................ 331/3
4,688,006 A 8/1987 Wong et al.
4,723,307 A * 2/1988 Clark et al. .................. 455/103
4,914,728 A * 4/1990 Fullerton ...................... 333/118
6,320,462 B1 11/2001 Alley
6,498,535 B1 * 12/2002 Allen et al. .................. 330/307
6,741,207 B1 * 5/2004 Allison et al. ................ 342/371
6,958,663 B2 * 10/2005 Eihama et al. ............... 333/156
7,319,370 B2 1/2008 Napijalo
7,538,635 B2 5/2009 Fukuda et al.
2002/0153971 A1 10/2002 Hershtig
2006/0035615 A1 2/2006 Hoover
2007/0035360 A1 2/2007 Benham
2009/0146764 A1 6/2009 Chen
2009/0284326 A1 11/2009 Napijalo
2009/0295497 A1 12/2009 Dowling

* cited by examiner

*Primary Examiner* — Patricia Nguyen
(74) *Attorney, Agent, or Firm* — Tarolli, Sundheim, Covell & Tummino LLP

(57) ABSTRACT

A circuit for amplifying an input signal can comprise a plurality of couplers. A splitting coupler of the plurality of couplers can receive the input signal and a combining coupler of the plurality of couplers can provides an output signal. N number of amplifiers can be included in the circuit to amplify the input signal, wherein N is a non-binary integer greater than one. At least one of the plurality of couplers can comprise a hybrid coupler that has two ports terminated into substantially equal reactances.

16 Claims, 6 Drawing Sheets

HYBRID COUPLER

TECHNICAL FIELD

This invention relates to a hybrid coupler. More particularly, this invention relates to a system for providing a phase shift at a hybrid coupler.

BACKGROUND

A coupler can be implemented as a power coupler or a directional coupler. Power couplers (e.g., power splitters and, when used in reverse, power combiners) and directional couplers are passive devices that can be used in the field of radio technology. A coupler can be implemented as a pair of transmission lines that provide mutual inductance and capacitance. A power coupler can couple a defined amount of the electromagnetic power in a transmission line to another port where the power can be used in another circuit. A directional coupler can be configured to couple power flowing in one direction such that power entering the output port is not coupled. Directional couplers and power dividers have many applications, these include; providing a signal sample for measurement or monitoring, feedback, combining feeds to and from antennae, and providing taps for cable distributed systems such as cable TV.

A coupler can have a coupling factor that defines an output power at an output port of a coupler relative to a power provided at an input port of the coupler. The coupling factor represents a primary property of a directional coupler. Coupling factor is a negative quantity when expressed in decibel ratio, although in some examples the minus sign is dropped (but still implied). The coupling factor can vary with frequency.

SUMMARY OF THE INVENTION

One example relates to a circuit for amplifying an input signal that can comprise a plurality of couplers. A splitting coupler of the plurality of couplers can receive the input signal and a combining coupler of the plurality of couplers can provide an output signal. N number of amplifiers can be included in the circuit to amplify the input signal, wherein N is a non-binary integer greater than one. At least one of the plurality of couplers can comprise a hybrid coupler that has two ports terminated into equal reactances (equal in both phase and amplitude).

Another example relates to a system for amplifying an input signal. The system can comprise a signal source to provide the input signal. The system can also comprise a phase compensating amplifier system comprising N number of amplifiers configured to amplify the input signal, wherein N is a non-binary integer greater than one. The phase compensating amplifier system can also comprise a plurality of couplers arranged and configured to compensate for a non-linear insertion phase of a plurality of couplers. At least one of the couplers can comprise a hybrid coupler to provide a phase advance of the input signal. The system can further comprise a load that receives an output signal from the phase compensating amplifier system.

Yet another example relates to a hybrid coupler comprising a thru port terminated into a first reactance. The hybrid coupler can also comprise a coupled port terminated into a second reactance, substantially equal to the first reactance. The hybrid coupler can further comprise an input port to receive an input signal. An isolated port of the hybrid coupler can provide an output signal. The output signal can have a phase shift relative to the input signal equal to about two times a delay of the thru port of the hybrid coupler minus 90°.

DETAILED DESCRIPTION

An amplifying system can include a phase compensating amplifier system. The phase compensating amplifier system can include a plurality of amplifiers arranged to amplify an input signal. The phase compensating amplifier system can also include a plurality of couplers to provide the input signal to the plurality of amplifiers. Moreover, the couplers can be arranged and configured in a manner that compensates for insertion phase (e.g., delay) of the couplers. To provide this compensation, one or more hybrid couplers can be employed.

Figure 1:
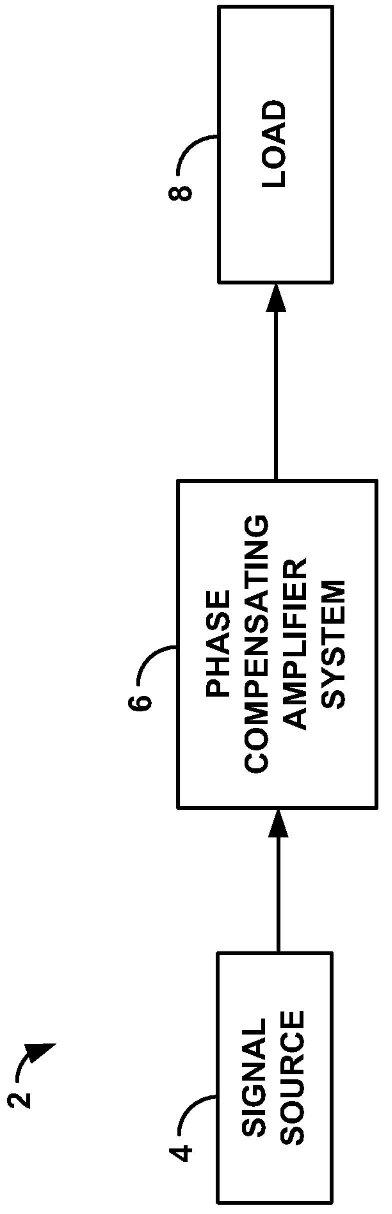
FIG. 1 illustrates an example of a system with a phase compensating amplifier system.

FIG. 1 illustrates an example of an amplifying system 2. The amplifying system 2 can include a signal source 4 that can provide an input signal. In some examples, the signal source 4 could be representative of an audio and/or a video signal source, such as a broadcast signal source. The input signal could be, for example, a frequency modulated (FM) signal, an amplitude modulated (AM) signal, a quadrature modulation signal, etc. The input signal can be provided to a phase compensating amplifier system 6. The phase compensating amplifier system 6 can be configured as a circuit that includes N number of amplifiers, where N is an integer greater than two, and N does not equal $2^K$, where K is an integer greater than or equal to one. In this manner, N can be any positive non-binary integer greater than one (e.g., 3, 5, 6, 7, 9, etc.). Moreover, the N number of amplifiers can be arranged in parallel, wherein a plurality of couplers are employed to split the input signal and combine signals output by the N number of amplifiers to drive a load 8. The load 8 could be implemented, for example, as a resistive and/or a reactive load, such as a transmission line and/or an antenna.

Figure 2:
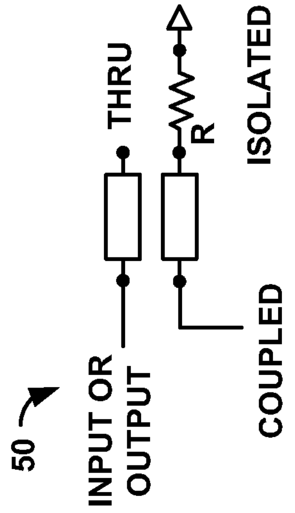
FIG. 2 illustrates an example of a coupler.

Each of the plurality of couplers can be implemented as a power splitter or a power combiner. FIG. 2 illustrates an example of a coupler 50 that could be employed as one of the couplers included in the phase compensation amplifier system 6. The coupler 50 can include an input port (labeled in FIG. 2 as "INPUT OR OUTPUT") for receiving an input signal in examples where the coupler 50 is implemented as a power splitter. Additionally, the coupler 50 can include in isolated port (labeled in FIG. 2 as "ISOLATED") that can be terminated with a terminating resistor that has a resistance denoted as 'R'. In some examples, the resistance can be 50 ohms. Additionally, the isolated port can be coupled via the terminating resistor to a neutral node (e.g., ground). In some examples, such as examples where the coupler 50 is configured as a power combiner, the input port could be an output port and can provide an output signal, while the coupled port and the thru port can receive input signals that are combined to the output signal.

The coupler 50 can include a thru port (labeled in FIG. 2 as "THRU") that can provide a delayed version of the input signal. The coupler 50 can also include a coupled port (labeled in FIG. 2 as "THRU") that can provide a version of the input signal that has a delay substantially equal to the delay at the thru port, plus about 90°. In some examples, the input signal could be an FM signal with a relatively constant amplitude of about 1 volt. In such a situation, a voltage at the thru port ($V_{thru}$) could be determined from Equation 1, while a voltage at the coupled port ($V_{coupled}$) could be determined from Equation 2. It is to be understood that in other examples, an input signal with a variable voltage, and/or a voltage other than 1 volt could be employed.

$$V_{thru} = \frac{\sqrt{1-K^2}}{\sqrt{1-K^2}\cos((B)(L)) + j\sin((B)(L))} \quad \text{Equation 1}$$

$$V_{coupled} = \frac{jK\sin((B)(L))}{\sqrt{1-K^2}\cos((B)(L)) + j\sin((B)(L))} \quad \text{Equation 2}$$

$$B = \frac{2\pi}{\lambda} \quad \text{Equation 3}$$

$$\lambda = \frac{Vp}{f} \quad \text{Equation 4}$$

wherein:

K is a coupling coefficient of the coupler 50, which is a value between 0 and 1, which can be based on the physical characteristics of a transformer in the coupler 50;

λ is a wavelength, in meters of the input signal;

f is a frequency, in hertz (Hz) of the input signal.

Vp is a propagation velocity of a medium containing the coupler 50, in meters per second. For air, this value can be equal to about $300\times10^6$ meters per second; and L is the length of the coupler 50, in meters.

In examples where the coupler 50 is arranged as a power splitter, such as a directional coupler, the coupler 50 can have the coupling factor, C, in decibels (dB) defined by equation 5.

$$C = 10\log\left(\frac{P_3}{P_1}\right) \quad \text{Equation 5}$$

wherein:

$P_1$ is the power of a signal provided to the input port; and $P_3$ is the power of a signal output at the coupled port.

The coupling coefficient, K and the coupling factor C are related properties. Equation 6 defines the relationship between the coupling coefficient, K and the coupling factor C for the coupler 50.

$$K = 10^{\frac{C}{20}} \quad \text{Equation 6}$$

Figure 3:
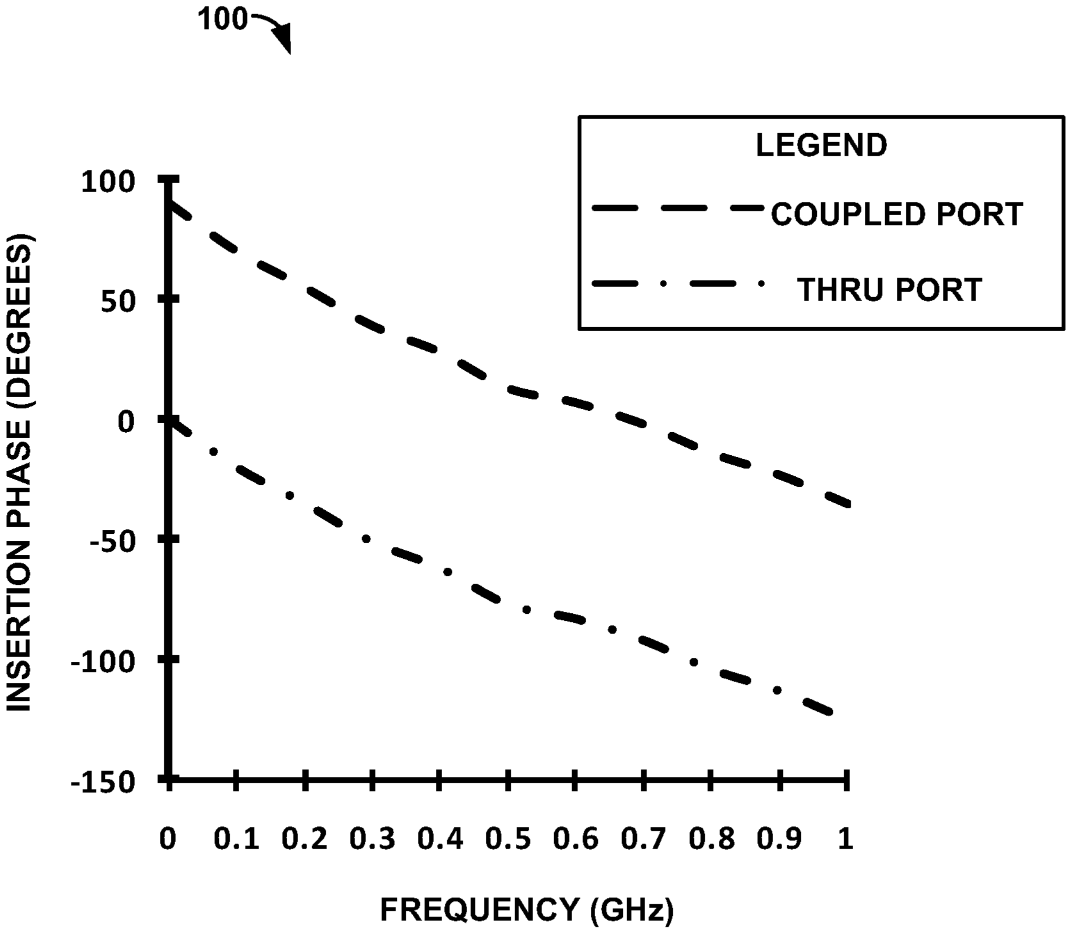
FIG. 3 illustrates a graph depicting an insertion phase of a coupler.

FIG. 3 illustrates an example of a graph 100 depicting insertion phase (e.g., delay) in degrees of a coupler (such as the coupler 50) illustrated in FIG. 2, plotted as a function of frequency in gigahertz (GHz) of an input signal. In FIG. 3, the insertion phase is plotted for a thru port (such as the thru port illustrated in FIG. 2) of the coupler, as well as a coupled port (such as the coupled port illustrated in FIG. 2) of the coupler. As illustrated, the insertion phase of the thru port and the coupled port are offset by 90°. As established in Equations 1 and 2 described with respect to FIG. 2 and illustrated in the graph 100, the coupler provides a nonlinear insertion phase (versus frequency) to the input signal at both the thru port and the coupled port.

Figure 4:
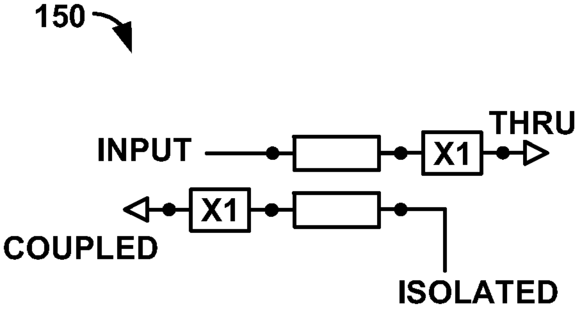
FIG. 4 illustrates an example of a hybrid coupler.

FIG. 4 illustrates an example of a hybrid coupler 150. The hybrid coupler 150 can be configured to provide a coupling factor of about −3 dB (such as about −2.8 dB). In some examples, the hybrid coupler 150 can be referred to as a 3 dB hybrid. The hybrid coupler 150 can be similar to the coupler 50 illustrated in FIG. 2, such that Equation 1-6 and FIG. 3 can characterize performance characteristics of the hybrid coupler 150. The hybrid coupler 150 can be configured such that an input port receives an input signal and an isolated port provides an output signal. Moreover, a thru port and a coupled port of the hybrid coupler 150 can be terminated into equal reactances, which reactances are designated in FIG. 4 as "X1." The reactances can be implemented, for example, as a capacitor and/or an inductor. In other examples, the reactances can be at or near 0, such that the thru port and the coupled port can be terminated into a neutral node (e.g., ground), which can be referred to as a short. In other examples, the reactances can be infinite, such that the reactances can be implemented as open circuits.

The isolated port of the hybrid coupler 150 can provide a delay version of the input signal input into the input port substantially equal to two times a delay of the thru port of the coupler 50 illustrated in FIG. 2 minus a phase shift of 90° (e.g., a phase advance). Accordingly, the hybrid coupler 150 can be employed to provide phase compensation (e.g., balancing) for the coupler 50 illustrated in FIG. 2.

Referring back to FIG. 1, the plurality of couplers can be arranged to compensate for insertion phase (e.g., by applying a delay plus or minus a phase shift) inherently present in each of plurality of couplers. By employment of the amplifying system 2, maximum power transfer can be attained to drive the load 8.

Figure 5:
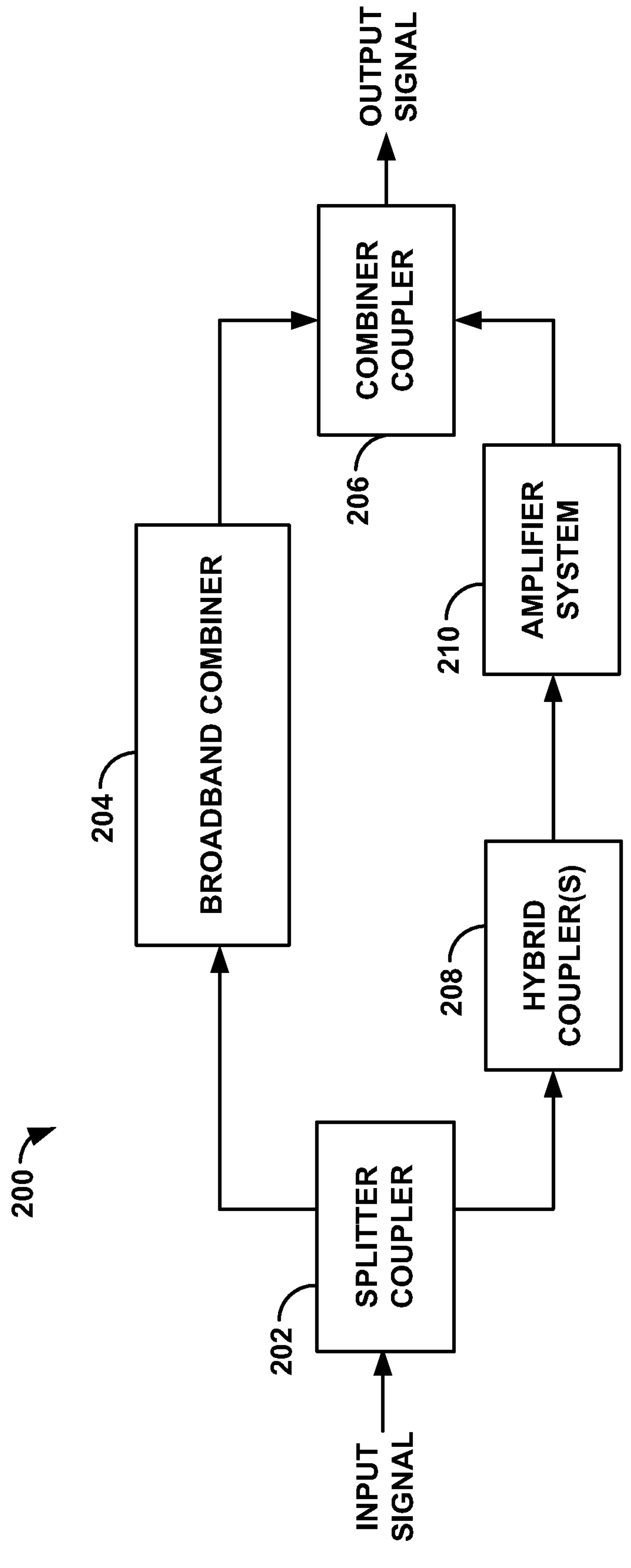
FIG. 5 illustrates an example of a phase compensating amplifier system.

FIG. 5 illustrates an example of a phase compensating amplifier system 200, such as the phase compensating amplifier system 6 illustrated in FIG. 1. The phase compensating amplifier system 200 can include a splitter coupler 202 that receives an input signal, such as the input signal described with respect to FIG. 1. The splitter coupler 202 could be implemented, for example, in a manner similar to the coupler illustrated in FIG. 2, wherein the input signal can be provided to an input port of the splitter coupler 202. In some examples, the splitter coupler 202 can have a coupling factor of about −4.77 dB. Moreover, a thru port of the splitter coupler 202 can be coupled to a broadband combiner 204. The broadband combiner 204 can include, for example, G number of amplifiers, wherein G is a positive, even integer. Additionally, the broadband combiner 204 can include F number of couplers, wherein F is and even integer greater than or equal to G. A signal output by the broadband combiner 204 can be provided to a combiner coupler 206.

A coupled port of the splitter coupler 202 can be provided to one or more hybrid couplers 208. The number of hybrid couplers included in the one or more hybrid couplers can be based on the number of amplifiers in the phase compensating amplifier system 200. A given hybrid coupler of the one or more hybrid couplers 208 can be implemented, in a manner similar to the hybrid coupler 50 illustrated in FIG. 4, wherein a signal from the coupled port of the splitter coupler 202 is provided to an input port of the given hybrid coupler. An isolated port of the given hybrid coupler can be implemented as an output node of the given hybrid coupler that could be coupled, for example, to an input port of another hybrid coupler or to an amplifier, such as in a manner described herein. Further, a coupled port and a thru port of the hybrid coupler can be terminated into substantially equal reactances, such as an electrically neutral node (e.g., ground), a capacitor and/or an inductor or simply left open. The given hybrid coupler can have a coupling factor of about −3 dB and a characteristic impedance (e.g., a system impedance) of about 50 ohms.

The one or more hybrid couplers 208 can be coupled to an amplifier system 210. The amplifier system 210 can include, for example, one or more amplifiers. Additionally, in some examples, the amplifier system 210 can also include one or more couplers. A signal output by the amplifier system 210 can be provided to the combiner coupler 206. The number of couplers included in the amplifier system can be based on the number of amplifiers in the phase compensating amplifier system 200.

The combiner coupler 206 can be implemented in a manner similar to the coupler 50 illustrated in FIG. 2 configured as a power combiner. In such a situation, the output of the one or more hybrid couplers 208 can be provided to a coupled port of the combiner coupler 206. Additionally, an output of the broadband combiner 204 can be provided to a thru port of the combiner coupler 206. An isolated port of the combiner coupler 206 can be coupled to a neutral node (e.g., ground) via a resistive load (e.g., 50 ohms). Furthermore, an output port of the combiner coupler 206 can be provided as an output of the phase compensating amplifier system 200.

Employment of the phase compensating amplifier system 200 illustrated in FIG. 5 provides a proper phase balance over a wide range of frequencies (e.g., one octave or more). Further, employment of the hybrid coupler ensures that the proper insertion phase is applied. Since, as illustrated and described with respect to FIGS. 2 and 3, the insertion phase of a coupler is nonlinear, employment of the hybrid coupler ensures that the proper insertion phase is applied when employing a non-binary number of amplifiers instead of an approximation of the proper insertion phase.

Figure 6:
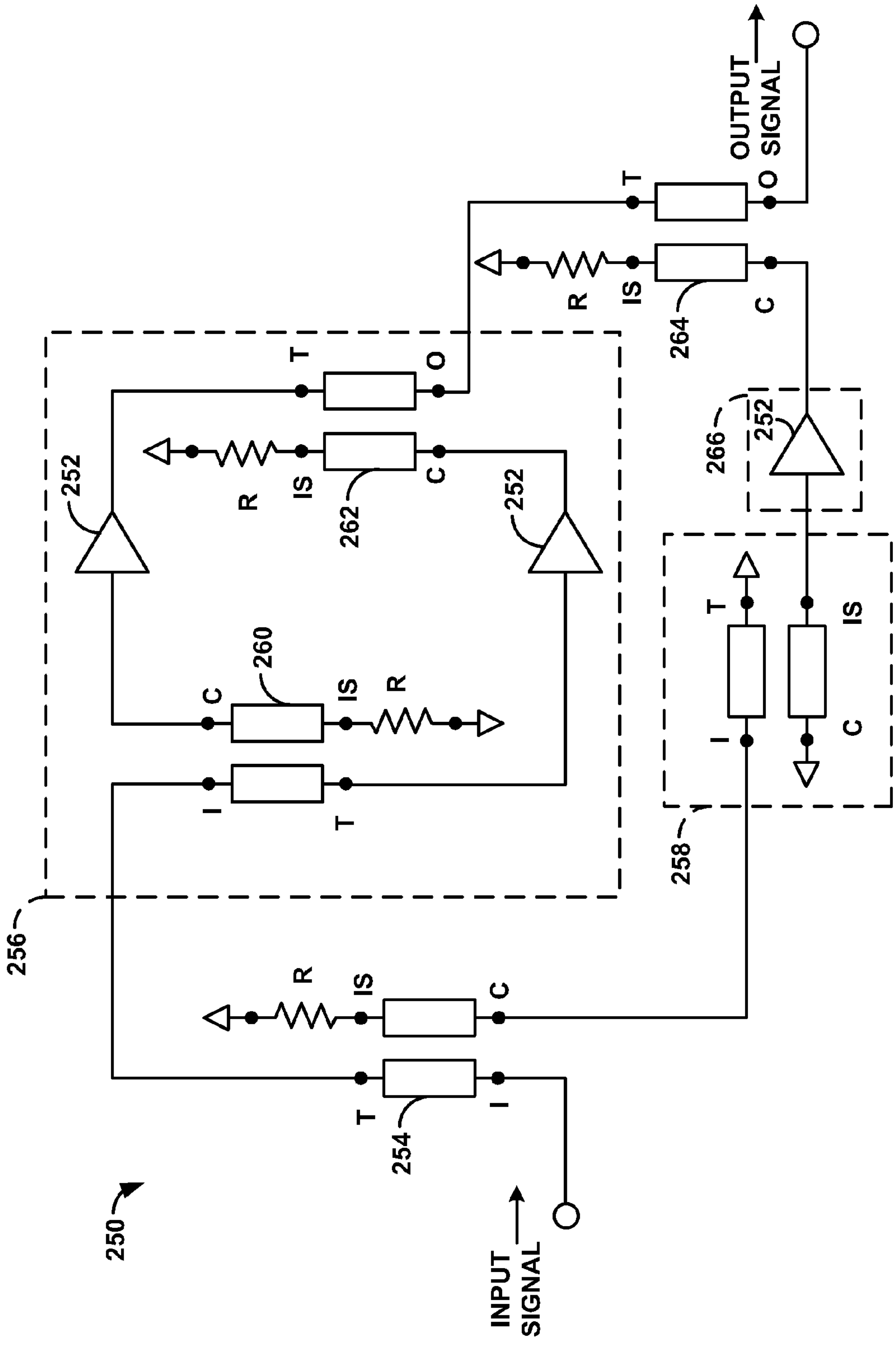
FIG. 6 illustrates an example of a circuit diagram of a phase compensating amplifier system.

FIG. 6 illustrates an example of a circuit diagram for a phase compensating amplifier system 250 that could be employed as the phase compensating amplifier system 6 illustrated in FIG. 1 and/or the phase compensating amplifier system illustrated in FIG. 5. It is noted that throughout FIGS. 6-8 a thru port of the couplers is labeled as ‘T’, a coupled port is labeled as ‘C’ and an isolated port is labeled as ‘IS.’ In examples where a coupler is configured as a power splitter or as a hybrid coupler, an input port is labeled as an ‘I’. Moreover, in examples where a coupler is configured as a power combiner, the output port of the coupler is labeled as ‘O’ instead of an ‘I’. Additionally, throughout FIGS. 6-8 resistive loads designated as ‘R’ are included. Unless otherwise noted, each of the resistive loads can have a resistance of about 50 ohms.

In the example illustrated in FIG. 6, the phase compensating amplifier system 250 includes three amplifiers 252. In FIG. 6, a coupler configured as a splitter coupler 254 can receive an input signal at an input port of the splitter coupler 254. A thru port of the splitter coupler 254 can be provided to a broadband combiner 256, which could be employed to implement the broadband combiner 204 illustrated in FIG. 5. A coupled port of the splitter coupler 254 can be coupled to an input port of a hybrid coupler 258, and an isolated port can be coupled to an electrically neutral node via a resistive load. The splitter coupler 254 can have a coupling factor, for example, of about −4.77 dB.

The broadband combiner 256 can include two of the three amplifiers 252 included in the phase compensating amplifier system 250. Moreover, the broadband combiner 256 can include two couplers 260 and 262 with coupling factors of about −3 dB (such as −2.8 dB) configured and arranged in a manner illustrated. An output node of the broadband combiner 256, which can be implemented as an output port of the coupler 262 can be provided to a thru port of a combiner coupler 264.

The hybrid coupler 258 can be implemented as a coupler with a −3 dB (such as −2.8 dB) coupling factor configured such that a coupled port and a thru port of the hybrid coupler 258 are terminated into (e.g. coupled to) loads with substantially equal reactance (e.g., an electrically neutral node, a combination of capacitors and inductors, and an open circuit, etc.). Moreover, as noted, the input port of the hybrid coupler 258 can receive a signal from the coupled port of the splitter coupler 254. An isolated port of the hybrid coupler 258 can be coupled to an amplifier system 266. In the example illustrated in FIG. 6, the amplifier system 266 includes the third amplifier 252 of the three amplifiers in the phase compensating amplifier system 250. The amplifier system 266 can provide an output signal to a coupled port of the combiner coupler 264.

The combiner coupler 264 can have a coupling factor of about −4.77 dB. The combiner coupler 264 can have an isolated port coupled to an electrically neutral node via a resistive load. Moreover, an output port of the combiner coupler 264 could be employed to provide an output signal of the phase compensating amplifier system 250. Relative to the input signal, the output signal can have a delay of about four times a delay (insertion phase) of a thru port at a single coupler, plus a phase shift of 90°.

Figure 7:
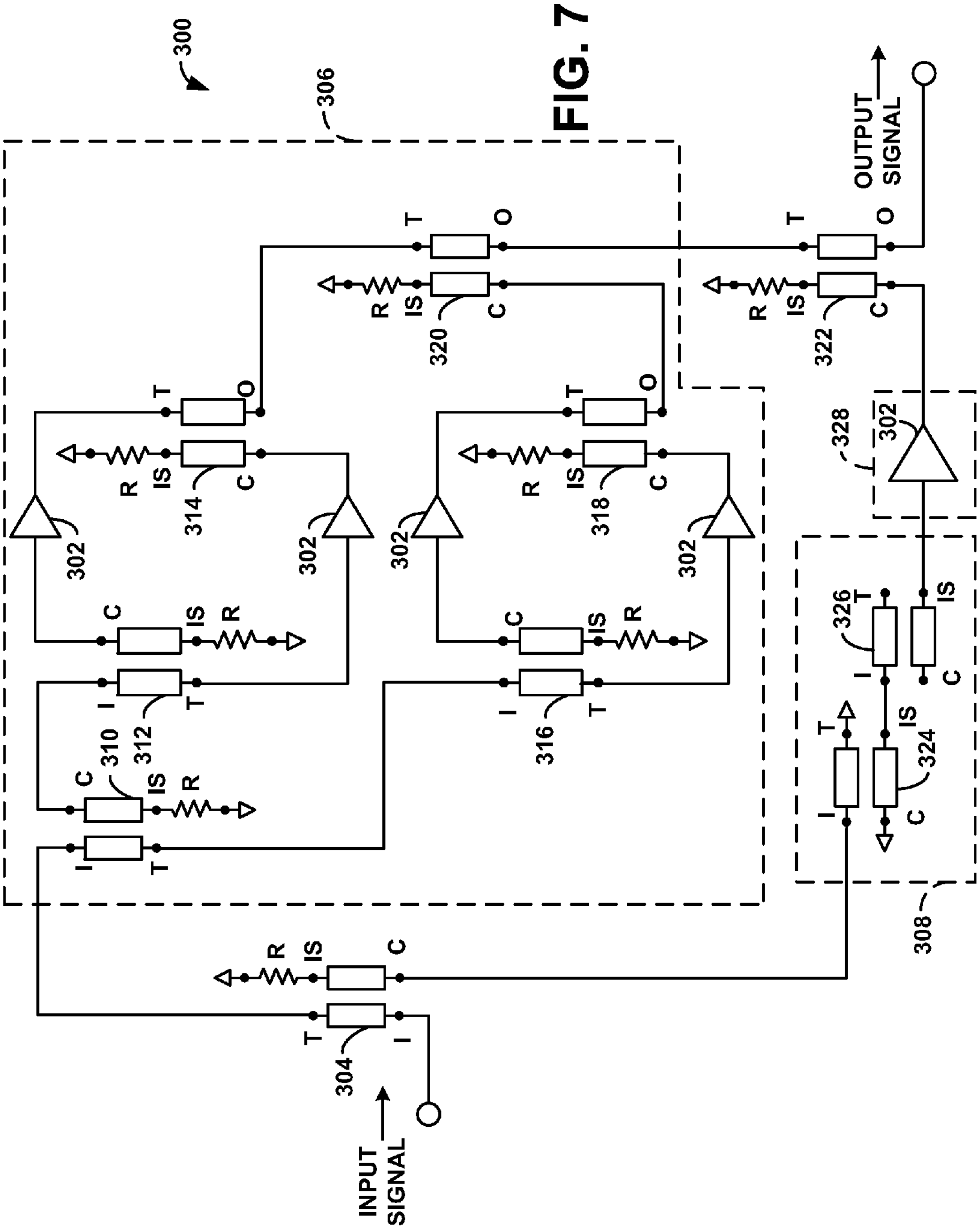
FIG. 7 illustrates another example of a circuit diagram of a phase compensating amplifier system.

FIG. 7 illustrates another example of a circuit diagram for a phase compensating amplifier system 300 that could be employed as the phase compensating amplifier system 6 illustrated in FIG. 1 and/or the phase compensating amplifier system illustrated 200 in FIG. 5. In the example illustrated in FIG. 7, five amplifiers 302 are included. The phase compensating amplifier system 300 can receive an input signal at an input port of a splitter coupler 304, which could be implemented in a manner similar to the splitter coupler 254 illustrated in FIG. 6. Accordingly, a thru port of the splitter coupler 304 can be provided to a broadband combiner 306 of the phase compensating amplifier system 300 and a coupled port of the splitter coupler 304 can be provided to two hybrid couplers 308.

The broadband combiner 306 can include four amplifiers 302 and six couplers 310, 312, 314, 316, 318 and 320 configured and arranged in a manner illustrated in FIG. 7. Each of the six couplers 310, 312, 314, 316, 318 and 320 can have a coupling factor of about −3 dB (such as −2.8 dB). Moreover, an output port of the coupler 320 can be provided to a thru port of a combiner coupler 322.

A first hybrid coupler 324 of the two hybrid couplers 308 can receive the signal from the coupled port of the splitter coupler 304 at an input port. Each of the two hybrid couplers 308 can have a coupling factor of about −3 dB (such as −2.8 dB). An isolated port of the first hybrid 324 coupler can be coupled to an input port of a second hybrid coupler 326 of the two hybrid couplers 308. Moreover, an isolated port of the second hybrid 326 coupler can be coupled to an amplifier system 328. Further, a thru port and a coupled port of the first hybrid coupler 324 can be terminated with substantially equal reactances (illustrated in FIG. 6, as electrically neutral nodes). Similarly, a thru port and a coupled port of the second hybrid coupler 326 can also be terminated with substantially equal reactances (illustrated in FIG. 6, as open circuits). The amplifier system 328 can include a fifth amplifier 302 of the five amplifiers in the phase compensating amplifier system 300. Moreover, the amplifier system 328 can output a signal to a coupled port of the combiner coupler 322.

The combiner coupler 322 can be implemented in a manner similar to the combiner coupler 264 illustrated in FIG. 6. Accordingly, the combiner coupler 322 can provide an output signal for the phase compensating amplifier system 300 at an output port of the combiner coupler 322. By employment of the phase combining amplifier system illustrated 300, the output signal can be provided with a delay of about six times a delay (insertion phase) of a thru port at a single coupler plus a phase shift of about 180°.

Figure 8:
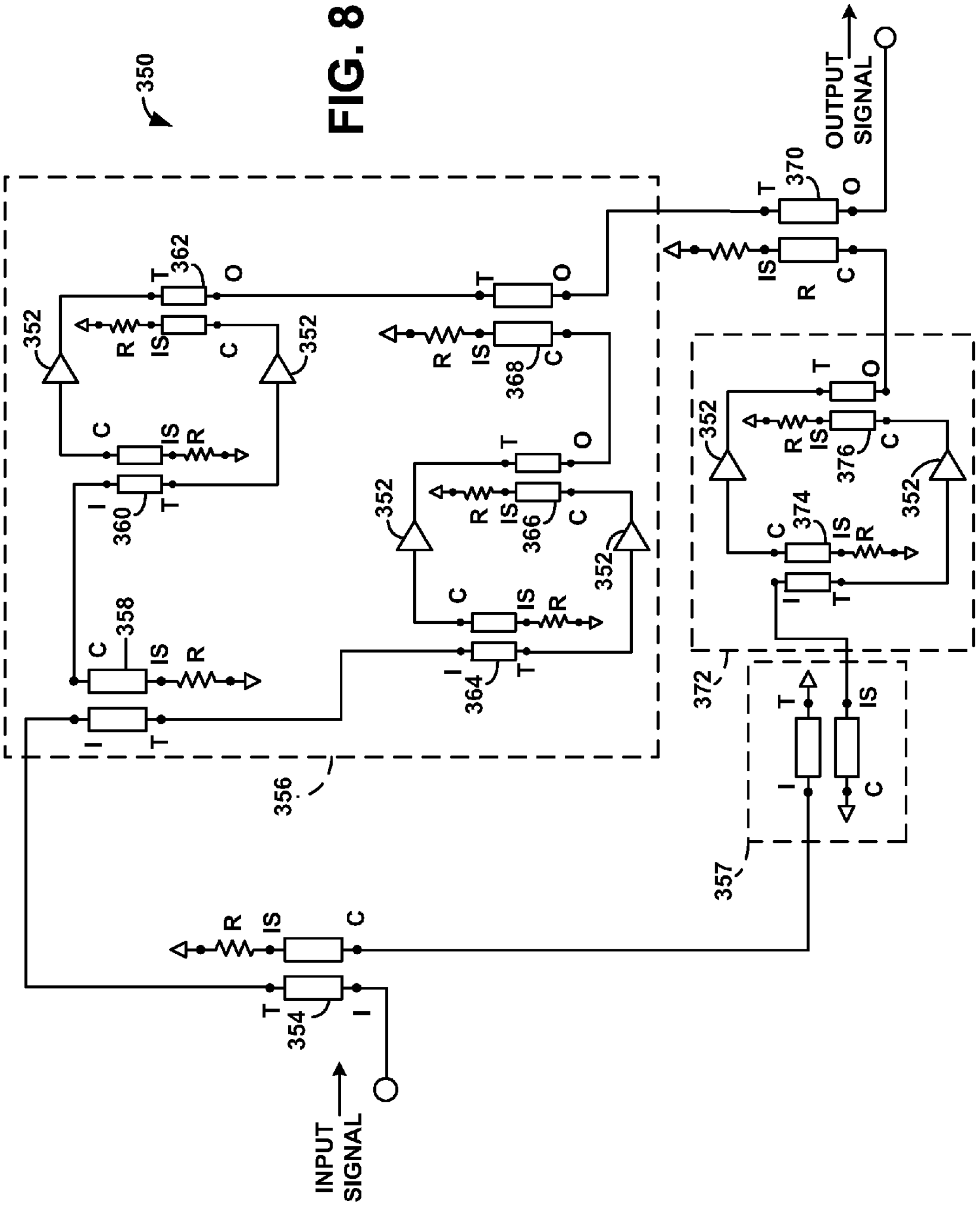
FIG. 8 illustrates yet another example of a circuit diagram of a phase compensating amplifier system.

FIG. 8 illustrates yet another example of a circuit diagram for a phase compensating amplifier system 350 that could be employed as the phase compensating amplifier system 6 illustrated in FIG. 1 and/or the phase compensating amplifier system illustrated 300 in FIG. 5. In the example illustrated in FIG. 8, six amplifiers 352 are included. The phase compensating amplifier system 350 can receive an input signal at an input port of a splitter coupler 354, which could be implemented in a manner similar to the splitter coupler 254 illustrated in FIG. 6. Accordingly, a thru port of the splitter coupler 354 can be provided to a broadband combiner 356 of the phase compensating amplifier system 350 and a coupled port of the splitter coupler 354 can be provided to a hybrid coupler 357.

The broadband combiner 356 can include four amplifiers 352 and six couplers 358, 360, 362, 364, 366 and 368 arranged and configured in a manner illustrated in FIG. 7. Each of the six couplers 358, 360, 362, 364, 366 and 368 can have a coupling factor of about −3 dB (such as −2.8 dB). Moreover, an output port of the coupler 368 can be provided to a thru port of a combiner coupler 370.

The hybrid coupler 357 can receive the signal from the coupled port of the splitter coupler 354 at an input port. An isolated port of the hybrid coupler 357 can be coupled to an amplifier system 372. Further, a thru port and a coupled port of the hybrid coupler 357 can be terminated with substantially equal reactances (illustrated in FIG. 6 as electrically neutral nodes).

The amplifier system 372 can include fifth and sixth amplifiers 352 of the six amplifiers 352 in the phase compensating amplifier system 350. Further, the amplifier system 372 can include two couplers 374 and 376 arranged and configured in the manner illustrated. The amplifier system 372 can output a signal to a coupled port of the combiner coupler 370.

The combiner coupler 370 can be implemented in a manner similar to the combiner coupler 264 illustrated in FIG. 6. Accordingly, the combiner coupler 370 can provide an output signal for the phase compensating amplifier system 350 that an output port of the combiner coupler 370. By employment of the phase compensating amplifier system 350 illustrated in FIG. 6, the output signal can be provided with a delay of about six times a delay (insertion phase) of a thru port of a single coupler plus a phase shift of about 180°.

What have been described above are examples. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims.

What is claimed is:

1. A circuit for amplifying an input signal comprising:

a plurality of couplers, wherein a splitting coupler of the plurality of couplers receives the input signal and a combining coupler of the plurality of couplers provides an output signal; and N number of amplifiers to amplify the input signal, wherein N is a non-binary integer greater than one;

wherein at least two of the plurality of couplers comprises a first hybrid coupler and a second hybrid coupler, each of the first and second hybrid couplers having two ports coupled to nodes with substantially equal reactances.

2. The circuit of claim 1, wherein the hybrid coupler has.

3. The circuit of claim 1, wherein the hybrid coupler has a thru port and a coupled port providing an open circuit.

4. The circuit of claim 1, wherein N is equal to five and an isolated port of the second hybrid coupler is coupled to an amplifier of the N number of amplifiers.

5. The circuit of claim 4, wherein the output signal has a delay of about 5 times a delay of a thru port of a given coupler of the plurality of couplers plus a phase shift of about 180 degrees relative to the input signal.

6. The circuit of claim 1, wherein N is equal to three and the output signal has a delay of about 4 times a delay of a thru port of a given coupler of the plurality of couplers plus a phase shift of about 90 degrees relative to the input signal.

7. The circuit of claim 1, wherein the circuit has a bandwidth of at least one octave.

8. The circuit of claim 1, wherein each of the plurality of couplers provides a substantially equal nonlinear insertion phase.

9. The circuit of claim 8, wherein:

$$V_{thru} = \frac{\sqrt{1-K^2}}{\sqrt{1-K^2}\cos((B)(L)) + j\sin((B)(L))};$$

$$B = \frac{2\pi}{\lambda}; \text{ and}$$

$$\lambda = \frac{Vp}{f};$$

wherein:

$V_{thru}$ comprises an output voltage at a thru port of a given coupler of the plurality of couplers;

K comprises a coupling coefficient of the given coupler;

λ comprises the wavelength, in meters of the input signal;

f is the frequency, in hertz (Hz) of the input signal;

Vp is the propagation velocity of a medium containing the given coupler, in meters per second; and L is the length of the given coupler, in meters.

10. The circuit of claim 9, wherein $$V_{coupled} = \frac{jK\sin((B)(L))}{\sqrt{1-K^2}\cos((B)(L)) + j\sin((B)(L))};$$

wherein:

$V_{coupled}$ comprises an output voltage at a coupled port of the given coupler of the plurality of couplers.

11. The circuit of claim 1, wherein the at least one hybrid coupler has a coupling factor of about −3 decibels (dB).

12. The circuit of claim 11, wherein each of the splitting coupler and the combining coupler have a coupling factor greater than a coupling factor of the at least one hybrid coupler.

13. A system for amplifying an input signal comprising:
a signal source to provide the input signal;
a phase compensating amplifier system comprising:
three amplifiers configured to amplify the input signal; and
a plurality of couplers arranged and configured to compensate for a nonlinear insertion phase of the plurality of couplers, wherein at least one of the couplers comprises a hybrid coupler to provide a phase advance of the input signal; and
a load that receives an output signal from the phase compensating amplifier system;
wherein the output signal has a delay substantially equal to three times a delay of a thru port of a given coupler plus a phase shift of about 90 degrees relative to the input signal.

14. The system of claim 13, wherein the load comprises a radio frequency (RF) antenna.

15. The system of claim 13, wherein the at least one hybrid coupler has two ports terminated into substantially equal reactances.

16. A circuit for amplifying an input signal comprising:
a plurality of couplers, wherein a splitting coupler of the plurality of couplers receives the input signal and a combining coupler of the plurality of couplers provides an output signal; and
N number of amplifiers to amplify the input signal, wherein N is a non-binary integer greater than one;
wherein at least one of the plurality of couplers comprises a hybrid coupler that has two ports terminated into substantially equal reactances, such that the hybrid coupler has one of a thru port and a coupled port providing an open circuit and a thru port and a coupled port terminated into a short.

* * * * *